United States Patent [19]

Ahmed

[11] 4,260,955

[45] Apr. 7, 1981

[54] CURRENT AMPLIFIER WITH REGENERATIVE LATCH SWITCH

[75] Inventor: Adel A. A. Ahmed, Clinton Township, Hunterdon County, N.J.

[73] Assignee: RCA Corporation, New York, N.Y.

[21] Appl. No.: 57,107

[22] Filed: Jul. 12, 1979

[51] Int. Cl.³ .............................................. H03F 3/04
[52] U.S. Cl. ................................... 330/288; 307/288; 307/297; 330/257
[58] Field of Search ............................... 330/288, 257; 307/252 C, 288, 289, 297

[56] References Cited

U.S. PATENT DOCUMENTS

| 3,790,897 | 2/1974 | Wheatley | 330/257 |
| 4,119,924 | 10/1978 | Ahmed | 330/288 |

Primary Examiner—Harold A. Dixon
Attorney, Agent, or Firm—Paul Rasmussen; Peter M. Emanuel; Allan J. Jacobson

[57] ABSTRACT

A regenerative latch switch conducts responsive to a RESET pulse to selectively divert applied input current from the input circuit of a current amplifier such as a current mirror amplifier. Responsive to an ensuing SET pulse conduction of the regenerative latch switch is interrupted, so applied input current flows to the input circuit of the current amplifier for amplification.

9 Claims, 1 Drawing Figure

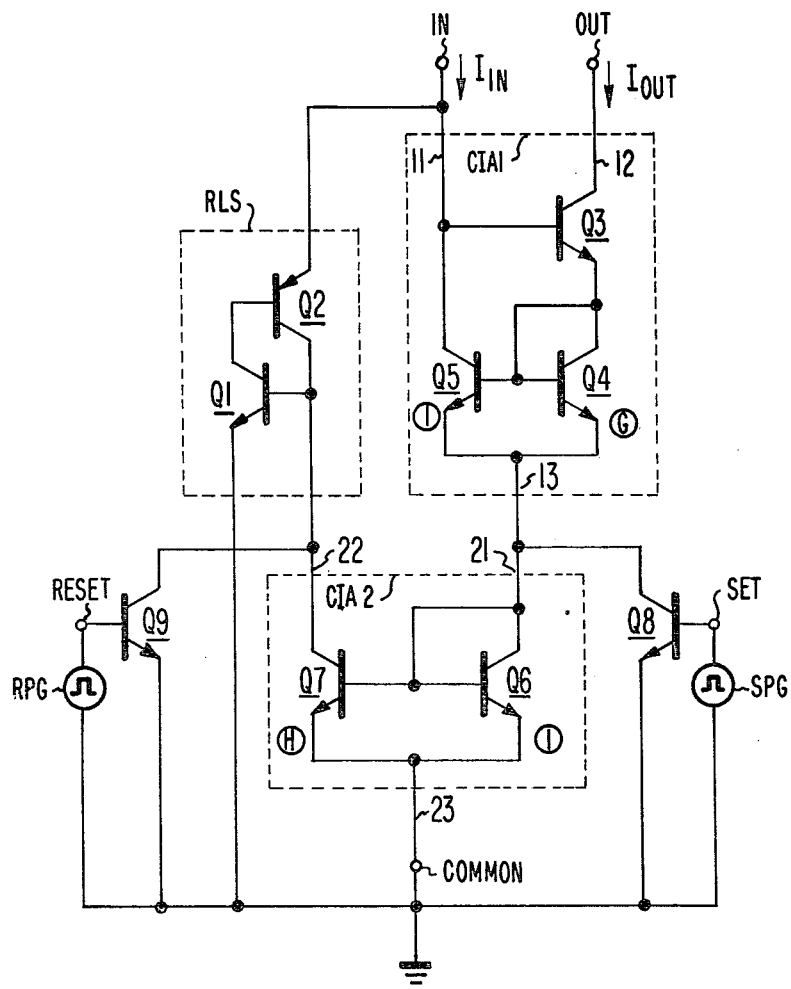

CURRENT AMPLIFIER WITH REGENERATIVE LATCH SWITCH

The present invention relates to switched current amplifiers and more particularly those of a new type in which current amplifier action can be electrically controlled for relatively long duration by control signals of relatively short duration.

A particular type of switched current amplifier is the switched current mirror amplifier, a circuit selectively operating as a current mirror amplifier.

As used herein, the term current mirror amplifier means a linear inverting current amplifier of the kind comprising: current-to-voltage converter means responsive to the amplifier input current for producing a voltage and a voltage-to-current converter means responsive to that voltage for producing the amplifier output current. Each converter means exhibits a respective current/voltage characteristic, which may be non-linear, related to each other by a factor G independent of the magnitude of the current being amplified. These converters have characteristics which track each other with changes in temperature, for providing an overall amplifier gain wherein the ratio of output current to input current magnitudes equals the factor G over substantial ranges of both temperature and the magnitude of the amplified current. A.A.A. Ahmed in U.S. Pat. No. 3,973,215 issued Aug. 3, 1976 and entitled "CURRENT MIRROR AMPLIFIER", for example, and T. M. Cartwright, Jr., in his U.S. Pat. No. 4,064,506 issued Dec. 20, 1977 and entitled "CURRENT MIRROR AMPLIFIERS WITH PROGRAMMABLE CURRENT GAINS", describe switched current mirror amplifiers in which current mirror amplifier action is maintained only for the duration of control signals within a first range of levels.

Particularly in cases where one wishes to intermix injection-current-logic (I²L) or other current-mode logic together with linear circuits on the same monolithic integrated circuit, the present inventor perceives a need for a switched current mirror amplifier where the control signals need be only briefly applied—e.g. in the form of RESET and SET pulses for conditioning the switched current mirror amplifier for and not for current mirror amplification, respectively. While one could simply combine an RS flipflop with one of the known switched current mirror amplifiers to perform this function, it is desirable that the bistable memory element used in the control circuitry for the switched current mirror amplifier need not be supplied operating current of its own. This requirement can be met by using current flowing to the current mirror amplifier as operating current for the bistable memory element, but care should be taken to avoid the application of SET or RESET pulses introducing spurious responses into the output of the current-mirror amplifier.

SUMMARY OF INVENTION

The present invention is embodied in a switched current mirror amplifier or its like of the following type. A regenerative latch switch conducts responsive to RESET pulses to selectively divert applied input current from the input circuit of the current amplifier; and responsive to SET pulses the regenerative latch switch stops conducting, which allows input current to flow to the input circuit of the current amplifier.

DESCRIPTION OF DRAWING

The sole FIGURE is a schematic diagram of a switched current amplifier which embodies the present invention and can be more specifically described as a switched current mirror amplifier.

DETAILED DESCRIPTION

This switched current mirror amplifier includes a regenerative latch switch means RLS, which comprises an NPN transistor Q1 and a PNP transistor Q2 which have their respective collector electrodes each connected to the base electrode of the other for providing a regenerative feedback loop tending to maintain Q1 and Q2 in saturated conduction to provide a conductive path between the input terminal IN of the FIG. 1 switched current mirror amplifier, to which the emitter electrode of Q2 connects, and the grounded emitter of Q1. As will be substantially explained the regenerative latch switch RLS is conductive between terminal IN and ground, subsequent to each application of SET signal to terminal SET, until such time as a RESET signal is applied to terminal RESET or the flow of input current $I_{IN}$ through terminal IN is interrupted to rob the regenerative latch switch means RLS of sustaining current. The conduction of regenerative latch switch means RLS substantially reduces the potential between the common terminal COMMON of the FIG. 1 switched current mirror amplifier and its input terminal IN, as the regenerative latch switch means RLS diverts the current $I_{IN}$ to itself from other portions of the switched current mirror amplifier. This results in there being no demand for an output current $I_{OUT}$ at the output terminal OUT of the FIG. 1 switched current mirror amplifier.

An output current $I_{OUT}$ flows through the output terminal OUT of the FIG. 1 switched current mirror amplifier which output current is proportionally responsive to an input current $I_{IN}$ applied to its input terminal IN, during time periods beginning at times RESET pulses are applied to the reset terminal RESET from a reset pulse generating means RPG and ending at times SET pulses are subsequently applied to the set terminal SET from a set pulse generating means SPG. The relationship between $I_{OUT}$ and $I_{IN}$ during these time periods is determined by a first component current amplifier CIA1. CIA1 is "a three-terminal current mirror amplifier of known type having an input connection" to terminal IN, having an output connection 12 to terminal OUT, and having a common connection 13. CIA1 includes an NPN transistor Q3 with base and collector electrodes connected to its input connection 11 and to its output connection 12, respectively. Q3 is provided degenerative emitter-to-base feedback by a simpler current mirror amplifier configuration including a diode-connected master mirroring transistor Q4 and a slave mirroring transistor Q5 and having a current gain of $-1/G$, where Q4 and Q5 are both NPN transistors and G is a positive number, which feedback stabilizes the current gain of CIA1 to a value of $-G$ as between its input connection 11 and output connection 12. The current gain of $-1/G$ for the simpler current mirror configuration is achieved by making the effective area of the emitter-base junction of Q4 to be G times that of Q5 as indicated by the encircled "G" next to the emitter of Q4 and encircled "1" next to the emitter of G5, assuming the doping profiles of these junctions to be similar.

The combined $I_{IN}$ plus $I_{OUT}$ current flow during these periods of time from the common connection 13 of CIA1 is applied to the input connection 21 of a second component current amplifier CIA2 and flows through the input circuit of CIA2 to the common terminal COMMON of the FIG. 1 switched current amplifier, which terminal is shown as being grounded. CIA2 is shown as a simple three-terminal current mirror amplifier having an output connection 22 and a common connection 23 in addition to its input connection 21. NPN transistor Q6 in the input circuit of current amplifier CIA2 is diode-connected, being provided with direct-coupled collector-to-base feedback to adjust its emitter-to-base potential to a value such as to condition its collector-to-emitter path for conducting all of the current applied to the input connection 21 except for the relatively small base currents of Q6 and Q7. The diode-connected transistor Q6 in the input circuit of current amplifier CIA2 thus serves as a means for sensing the level of the combined currents flowing in the input and output circuits of current amplifier CIA1.

The application of the emitter-to-base potential of Q6 as the emitter-to-base potential of Q7 conditions Q7 to conduct a current through its collector-to-emitter path which is H times as large as the current through the collector-to-emitter path of Q6. H is the ratio of the effective area of the emitter-base junction of Q7 to that of the emitter-base junction of Q6 as shown by the encircled "H" and "1" near their respective emitter electrodes, the doping profiles of these junctions being assumed to be similar. The conduction of the collector-to-emitter path of Q7 diverts the collector current of Q2 to this path, interrupting the direct coupling of the collector electrode of Q2 to the base electrode of Q1 by reducing the emitter-to-base voltage of Q1 below the value Q1 requires to sustain conduction in its collector-to-emitter path. Under these conditions Q2 is provided with no path for base current flow thereto and is forced out of conduction. The regenerative latch switch RLS is thus non-conductive between terminal IN and ground so long as $I_{IN}$ flows through the input circuits of current amplifiers CIA1 and CIA2.

Presume the FIG. 1 switched current mirror amplifier to be in its reset condition, wherein $I_{OUT}$ is demanded at terminal OUT which is G times as large as the $I_{IN}$ applied to terminal IN. To place the switched current mirror amplifier in its set condition where no output current is demanded at terminal OUT, the set pulse generating means SPG applies a positive SET pulse to the base of NPN transistor Q8 of sufficient amplitude to make Q8 exhibit a collector-to-emitter path of sufficiently high conductance as to divert the flow of IN + $I_{OUT}$ to itself from the input circuit of current amplifier CIA2, reducing the potential across that input circuit to such level that neither Q6 nor Q7 are conditioned to conduct. The non-conduction of Q7 removes the interruption to direct coupling from the collector of Q2 to the base of Q1, and their regenerative loop connection establishes conduction in Q1 and Q2 to make the regenerative latch switch means RLS conductive between terminal IN and ground. This reduces the potential between terminal IN and ground to such value that the input circuits of current amplifiers CIA1 and CIA2 cannot be conductive, CIA1 and CIA2 being types of current amplifiers respectively requiring $2V_{BE}$ and $1V_{BE}$ input voltages to be conductive, $V_{BE}$ being the threshold forward-bias potential required across the emitter-to-base junction of a transistor in order to be biased for conduction.

After the SET pulse Q8 returns to non-conduction $I_{IN}$ continues to flow through regenerative latch switch means RLS which can maintain a voltage of $V_{BE} + V_{SAT}$, where $V_{SAT}$ is the emitter-to-collector voltage of a transistor in saturated conduction and is appreciably smaller than $V_{BE}$, across itself responsive to $I_{IN}$ flowing through it. The input circuits of CIA1 and CIA2 thus continue to be non-conductive owing to insufficient potential across their series connection.

Presuming the switched current mirror amplifier of FIG. 1 to be in its set condition, it is placed into its reset condition as follows. The reset pulse generating means RPG applies a positive pulse to the base of NPN transistor Q9 of sufficient amplitude to make Q9 exhibit a collector-to-emitter path of sufficiently high conductance as to divert the flow of the Q2 collector current to itself, rather than permitting its application to the base of Q1, and this reduces the emitter-to-base potential of Q1 below the value required to sustain a conductive collector-to-emitter path through Q1 so Q2 is deprived of base current and becomes non-conductive. That is, the conduction of Q9 interrupts the direct coupling between the collector of Q2 and base of Q1, by acting as a shunt short circuit. As long as this short circuit exists, Q1 and Q2 are rendered non-conductive. The regenerative latch switch-means RLS thus provides no conduction path between terminal IN and ground, so the current $I_{IN}$ flows to the input circuit of current amplifier CIA1 and thence to the input circuit of current amplifier CIA2. Responsive to $I_{IN}$ flowing through its input circuit amplifier CIA1 demands a current $I_{OUT}$ that is G times $I_{IN}$ at the terminal OUT. Responsive to $I_{IN}$ flowing through its input circuit amplifier CIA2 continues to interrupt the direct coupling between the collector of Q2 and the base of Q1, its output circuit acting as a shunt short circuit, even after the RESET pulse ends and Q9 returns to non-conduction.

The FIG. 1 circuit may be modified by replacing current amplifier CIA2 with a simple NPN transistor.

One skilled in art and armed with the foregoing disclosure will be able to readily design other embodiments of the present invention. For example, the collector of Q9 and output connection 22 of CIA2 need not selectively short-circuit the emitter-base junction of Q1 in the regenerative latch switch means, but alternatively can control the gate of a P-channel field effect transistor, the channel of which selectively short-circuits the emitter-base junction of Q2. Accordingly, the follwoing claims, particularly the first, should be liberally construed.

What is claimed is:

1. A switched current amplifier comprising:
   input, output and common terminals;
   a first component current amplifier having an input circuit connected between said input and common terminals, having an output circuit between said common and output terminals, and exhibiting current gain between its input and output circuits so long as the potential across its input circuit exceeds a threshold value;
   a regenerative latch switch means responsive to application of SET signals for selectively providing continuing condition between said input and common terminals to reduce the potential across the input circuit of said first component current amplifier below said threshold value, and responsive to applications of RESET signals for selectively providing continuing non-conduction between said input and common terminals.

2. A switched current amplifier as set forth in claim 1 wherein said regenerative latch switch means includes:

first and second transistor means respectively of the same conductivity type as said first component current amplifier and of a complementary conductivity type, each of said transistor means having input and output and common electrodes, each of said first and second transistor means having a respective input circuit through its input and common electrodes and having a respective output circuit through its common and output electrodes, the output circuit of each of said first and second transistor means being direct coupled to the input circuit of the other by the output electrode of each of said first and second transistor means being connected to the input electrode of the other, the common electrodes of said first and second transistor means being respectively connected to said common terminal and to said input terminal;

means responsive to RESET signals for interrupting the direct coupling of the output circuit of one of said first and second transistor means to the input circuit of the other, thereby to interrupt any flow of current between said input and common terminals through said regenerative latch switch means;

means for sensing the flow of current in a portion of said first component current amplifier as flows responsive to the interruption of current through said regenerative latch switch means;

means, responsive to said means for sensing the flow of current in said portion of said first component current amplifier, for interrupting the direct coupling of the output circuit of one of said first and second transistor means to the input circuit of the other; and means responsive to SET signals for restoring interrupted direct coupling of the output circuits of said first and second transistor means to the input circuits of each other.

3. A switched current amplifier as set forth in claim 2 wherein:

a second component current amplifier of the same conductivity type as the first is included, having an input circuit connecting the input and output circuits of said first component current amplifier to said common terminal for providing said means for sensing, and having an output circuit connected between said common terminal and a point of interconnection between the output electrode of said second transistor means and the input electrode of said first transistor means for providing said means for interrupting responsive to said means for sensing.

4. A switched current amplifier as set forth in claim 3 wherein said means responsive to SET signals essentially consists of means for selectively short-circuiting the input circuit of said second component current amplifier during each SET signal.

5. A switched current amplifier as set forth in claim 4 wherein said means responsive to a RESET signal essentially consists of means for selectively connecting during each RESET signal said common terminal and a point of interconnection between the output electrode of said first transistor means and the input electrode of said second transistor means.

6. A switched current amplifier as set forth in claim 2 wherein said means responsive to a RESET signal essentially consists of means for selectively connecting during each RESET signal said common terminal and a point of interconnection between the output electrode of said first transistor means and the input electrode of said second transistor means.

7. A switched current mirror amplifier comprising:

input, output, and common terminals:

first, second, and third transistors, each having respective base and emitter and collector electrodes, said second transistor being of a conductivity type complementary to that of said first and third transistors;

means connecting said first and second transistors in a regenerative latch circuit for selectively conducting current between said input and common terminals, said means including connection of the emitter electrode of said first transistor to said common terminal, including connection of the collector electrode of said first transistor to the base electrode of said second transistor, including connection of the emitter electrode of said second transistor to said input terminal, and including connection of the collector electrode of said second transistor to the base electrode of said first transistor;

means for connecting said third transistor in a first component current mirror configuration including a connection of said input teminal to the base electrode of said third transistor, including a connection of the collector electrode of said third transistor to said output terminal, including means connected between the base and emitter electrodes of said third transistor for stabilizing the effective current gain of said third transistor to predetermined value, and including current path means between the emitter electrode of said third transistor and said common-terminal;

means for sensing the current flow in said current path means to provide a control signal;

means responsive to said control signal for clamping the base electrode of said first transitor to its emitter electrode;

means responsive to a set signal for diverting current from said current path means, permitting said regenerative latch circuit to come into conduction;

means responsive to a reset signal for clamping the base electrode of said first transistor to its emitter electrode.

8. A switched current mirror amplifier as set forth in claim 7 including:

a pair of further transistors connected in a second current mirror amplifier, with respective emitter electrodes connected to said common terminal, with respective base electrodes having an interconnection therebetween, and with respective collector electrodes, the collector of one of these transistors being connected to the interconnection between base electrodes for arranging this transistor as said means for sensing the current flow in said current path, so said control signal appears at the interconnection between base electrodes, and the collector of the other of these transistors being connected to the base electrode of said first transistor for arranging this other transistor as said means responsive to said control signal for clamping the base electrode of said first transistor.

9. A switched current mirror amplifier as set forth in claim 8 incuding:

a pair of still further transistors with respective collector electrodes connected to the emitter electrode of said third transistor and to its base electrode respectively, with respective base electrodes to which the emitter electrode of said third transistor connects, and with respective emitter electrodes connected together and to the interconnection of the base electrodes of said further transistors, these interconnections of said still further transistors conditioning them to provide said means for stabilizing the effective current gain of said third transistor, said current path means being between the collector and emitter electrodes of the one of said still further transistors having its collector electrode connected to the emitter electrode of said third transistor.

* * * * *

UNITED STATES PATENT AND TRADEMARK OFFICE
CERTIFICATE OF CORRECTION

PATENT NO. : 4,260,955
DATED : 4/7/81
INVENTOR(S) : A. A. A. Ahmed

It is certified that error appears in the above—identified patent and that said Letters Patent is hereby corrected as shown below:

Col. 2, Line 19 - "substantially" should be -- subsequently -- ; and

Col. 4, Line 51 - "follwoing" should be -- following -- .

IN THE CLAIMS:

Col. 4, Line 65 - "condition" should be -- conduction -- .

Signed and Sealed this

Sixth Day of October 1981

[SEAL]

Attest:

GERALD J. MOSSINGHOFF

Attesting Officer    Commissioner of Patents and Trademarks